United States Patent
Ahn et al.

(10) Patent No.: US 10,020,274 B2
(45) Date of Patent: Jul. 10, 2018

(54) SOLDER PARTICLE

(71) Applicant: TETOS Co., Ltd., Asan-si, ChungNam (KR)

(72) Inventors: Woo Young Ahn, Hwaseong-si (KR); Seong Wan Park, Cheonan-si (KR)

(73) Assignee: TETOS Co., Ltd., Asan-si, Chungnam (KR)

( * ) Notice: Subject to any disclaimer, the term of this patent is extended or adjusted under 35 U.S.C. 154(b) by 0 days.

(21) Appl. No.: 15/611,804

(22) Filed: Jun. 2, 2017

(65) Prior Publication Data

US 2018/0158790 A1    Jun. 7, 2018

(30) Foreign Application Priority Data

Dec. 6, 2016    (KR) .......... 10-2016-0164829

(51) Int. Cl.
| | |
|---|---|
| *B23K 35/00* | (2006.01) |
| *B23K 35/02* | (2006.01) |
| *B23K 35/22* | (2006.01) |
| *H01L 23/00* | (2006.01) |
| *B23K 35/26* | (2006.01) |

(52) U.S. Cl.
CPC .......... *H01L 24/13* (2013.01); *B23K 35/0244* (2013.01); *B23K 35/262* (2013.01); *H01L 2224/1319* (2013.01); *H01L 2224/13582* (2013.01); *H01L 2224/13655* (2013.01); *H01L 2224/13671* (2013.01); *H01L 2924/014* (2013.01); *H01L 2924/01322* (2013.01)

(58) Field of Classification Search
CPC ............ B23K 35/0222; B23K 35/0244; B23K 35/025; B23K 35/22
USPC ................. 228/180.22, 248.1, 56.3
See application file for complete search history.

(56) References Cited

U.S. PATENT DOCUMENTS

| | | | |
|---|---|---|---|
| 2002/0070423 A1* | 6/2002 | Takafuji | H01L 21/4853 |
| | | | 257/532 |
| 2003/0090872 A1* | 5/2003 | Chu | H01L 23/04 |
| | | | 361/699 |
| 2015/0008576 A1* | 1/2015 | Khandekar | H01L 24/11 |
| | | | 257/737 |

* cited by examiner

*Primary Examiner* — Erin B Saad
(74) *Attorney, Agent, or Firm* — Revolution IP, PLLC

(57) ABSTRACT

Disclosed is a solder particle including a plastic core; a copper-free metal layer which is formed on an external surface of the plastic core; and a solder layer which is formed on the copper-free metal layer and contains not less than 85 wt % tin. Thus, it is possible to provide a solder particle with a copper-free metal layer, which is excellent in strength and conductivity and prevents or minimizes generation of a void during a reflow process or the like.

4 Claims, 6 Drawing Sheets

SOLDER PARTICLE

CROSS-REFERENCE TO RELATED APPLICATION

This application claims priority from Korean Patent Application No. 10-2016-0164829, filed on Dec. 6, 2016 in the Korean Intellectual Property Office, the disclosure of which is incorporated herein by reference.

BACKGROUND OF THE INVENTION (a) Field of the Invention

The present invention relates to a solder particle and a method of manufacturing the same.

(b) Description of the Related Art

A solder particle has been used as a bonding material in mounting a semiconductor chip, a resistor chip or the like small electronic part on to a printed circuit board (PCB). With recent miniaturization of an integrated circuit, the size of a pad or a space between the pads has decreased and the number of pads has increased, thereby causing a defect in an element due to unnecessary electric contact.

SUMMARY OF THE INVENTION

Accordingly, the present invention is conceived to solve the foregoing problems, and an object of the present invention is to provide a solder particle, which can prevent defective contact due to a decreased size of a pad or a narrowed space between the pads when electronic parts are mounted, and prevent a void from being formed during a reflow process or the like. This object of the present invention is given for illustrative purpose only, without limiting the scope of the present invention.

In accordance with an embodiment of the present invention, there is provided a solder particle including: a plastic core; a copper-free metal layer which is formed on an external surface of the plastic core; and a solder layer which is formed on the copper-free metal layer and contains not less than 85 wt % tin.

The copper-free metal layer and the solder layer may be successively formed in one chamber by a sputtering process.

The copper-free metal layer may contain an alloy of nickel and chrome, in which nickel content is higher than chrome content.

The thickness of the copper-free metal layer may be equal to or smaller than a hundredth of the thickness of the solder layer.

The solder particle may further comprise a protection layer on the external surface of the solder layer.

BRIEF DESCRIPTION OF THE DRAWINGS

The above and/or other aspects of the present invention will become apparent and more readily appreciated from the following description of the exemplary embodiments, taken in conjunction with the accompanying drawings, in which.

DETAILED DESCRIPTION OF THE EMBODIMENTS

Below, embodiments of the present invention will be described in detail with reference to accompanying drawings, in which like numerals refer to like elements and repetitive descriptions will be avoided as necessary.

In the following embodiments, terms of 'first,' 'second,' etc. will be used for distinguishing between elements without any limitative purpose, and words used in the singular include the plural unless the context clearly indicates otherwise.

Figure 1:
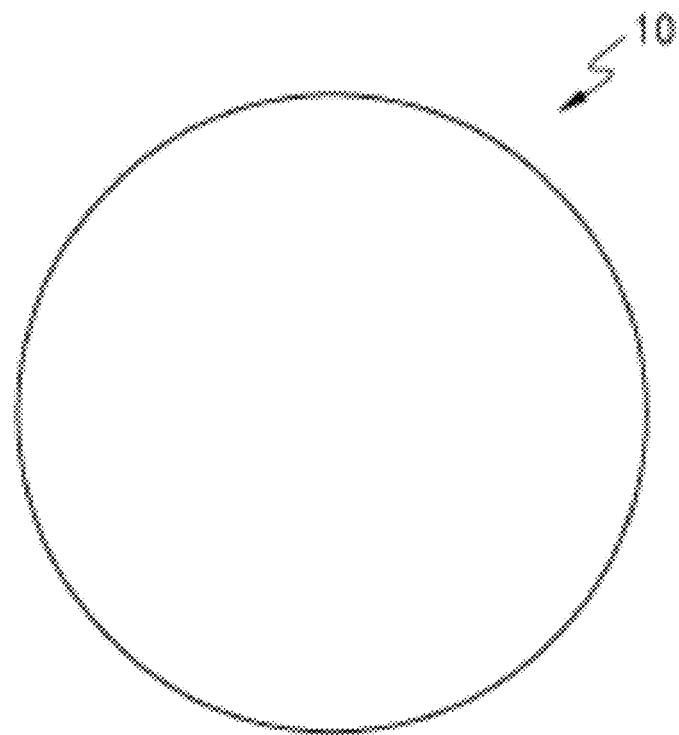
FIG. 1 is a front view of schematically showing a solder particle according to an embodiment of the present invention.
Figure 2:
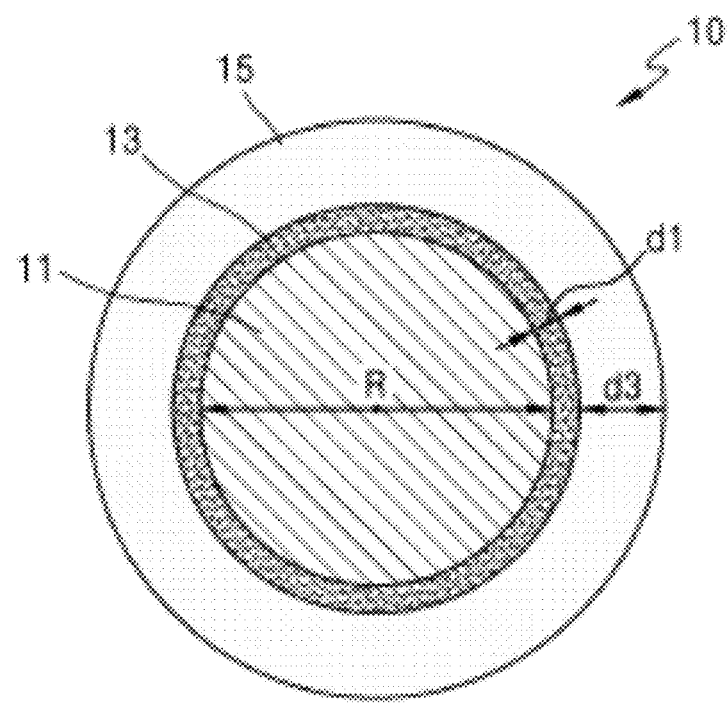
FIG. 2 is a cross-sectional view of the solder particle shown in FIG. 1.
Figure 3:
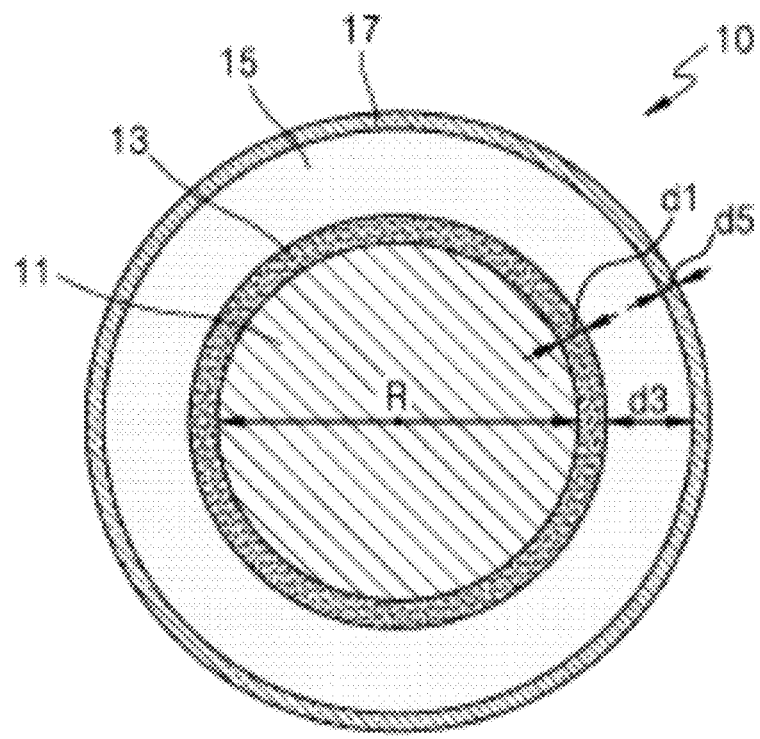
FIG. 3 is a cross-sectional view of a solder particle according to another embodiment of the present invention.

Referring to FIG. 1 to FIG. 3, a solder particle 10 includes a plastic core 11, a copper-free metal layer 13 on the plastic core 11, and a solder layer 15 on the copper-free metal layer 13.

The plastic core 11 is a spherical core having a smooth external surface, and includes an electrically insulating material. The plastic core 11 is a solid sphere filled with the electrically insulating material, and is distinct from a shell-type core of a hollow body. The electrically insulating material may include an insulating resin. The insulating resin may include at least one of polymethyl methacrylate (PMMA), polymethyl acrylate or the like acrylic resin, polysiloxane or the like silicon resin, polyethylene, polypropylene, and polystyrene or the like polyolefin resin. Alternatively, the insulating resin may include at least one of polycarbonate, polysulfone, polybutylene, polyester, polyurethane, styrene butadiene, polyether sulfone, polyvinyl butyral, polyvinyl formal, polyvinyl acetate, styrenedivinylbenzene, epoxy, and phenol. According to some optional embodiments, the plastic core 11 may include polymethyl methacrylate (PMMA) excellent in thermal resistance and impact strength. According to another optional embodiment, the plastic core 11 may include silicon excellent in thermal stability and high strength.

The copper-free metal layer 13 may include a conductive material, e.g. a metallic material, and is formed by a sputtering process. The metallic material may include one of an alloy of nickel (Ni) and chrome (Cr), titanium (Ti), molybdenum (Mo), stainless steel (SUS), and an alloy of them, and may be formed as a single layer or a multiple layer. According to an optional embodiment, the copper-free metal layer 13 may include the alloy of nickel and chrome. In the copper-free metal layer 13 including the alloy of nickel and chrome, a weight ratio of nickel to chrome may be selected within a range of 8:2 to 9.5:0.5. Chrome improves adhesion between the plastic core 11 and the solder layer 15. The adhesion between the plastic core 11 and the solder layer 15 in the copper-free metal layer 13 including the alloy of nickel and chrome is about 1.5 or more times higher than that in a copper-free metal layer including only nickel. If the weight ratio for chrome is selected within the foregoing range, the copper-free metal layer 13 covers the external surface of the plastic core 11 entirely without being peeled off, and improves the adhesion between the plastic core 11 and the solder layer 15. If the weight ratio for chrome is selected out of the foregoing range, the copper-free metal layer 13 may be peeled off. In other words, the copper-free metal layer 13 may be partially separated from the plastic core 11.

In addition, the copper-free metal layer 13 including the alloy of nickel and chrome is more improved in efficiency of being formed as a thin film during the sputtering process than the copper-free metal layer including only nickel. If the sputtering process is performed with only magnetic nickel, the thin film of the copper-free metal layer 13 may deteriorate in quality such as uniformity of thickness, etc. On the other hand, if the sputtering process is performed with chrome, i.e. with the alloy of nickel and chrome, it is possible to improve not only the quality of the thin film formed by the sputtering process, but also the adhesion between the plastic core 11 and the solder layer 15 as described above.

Figure 4:
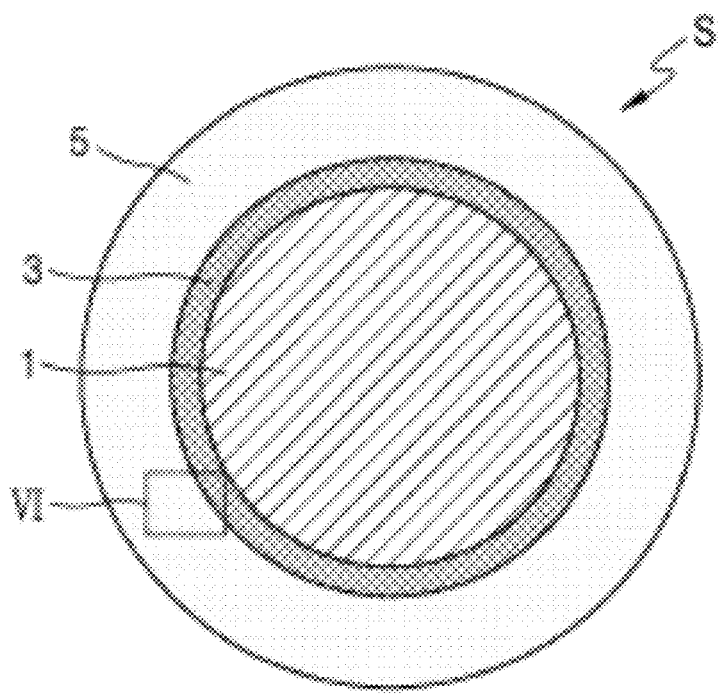
FIG. 4 is a cross-sectional view of a solder particle according to a comparative example.
Figure 5:
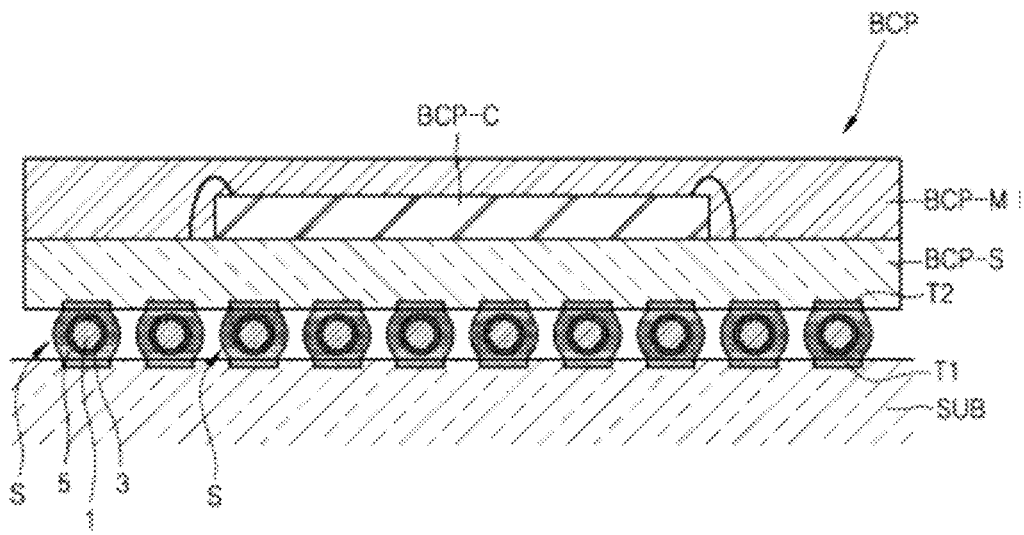
FIG. 5 is a cross-sectional view of schematically showing a packaging state using a solder particle.

Referring to FIG. 4, a solder particle S according to a comparative example includes a copper (Cu) layer 3 in between a plastic core 1 and a solder layer 5. If such a solder particle S is interposed in between a wiring substrate SUB and an element BCP (e.g. a semiconductor chip package for a ball grid array (BGA)) and then subject to reflow as shown in FIG. 5, the wiring substrate and the element are connected. The element BCP may include a substrate BCP-S, a semiconductor chip BCP-C mounted on to the substrate BCP-S, and a molding resin BCP-M provided on the semiconductor chip BCP-C. The solder particle S is interposed in between a terminal T2 of the substrate BCP-S and a terminal T1 of the wiring substrate SUB.

Figure 6:
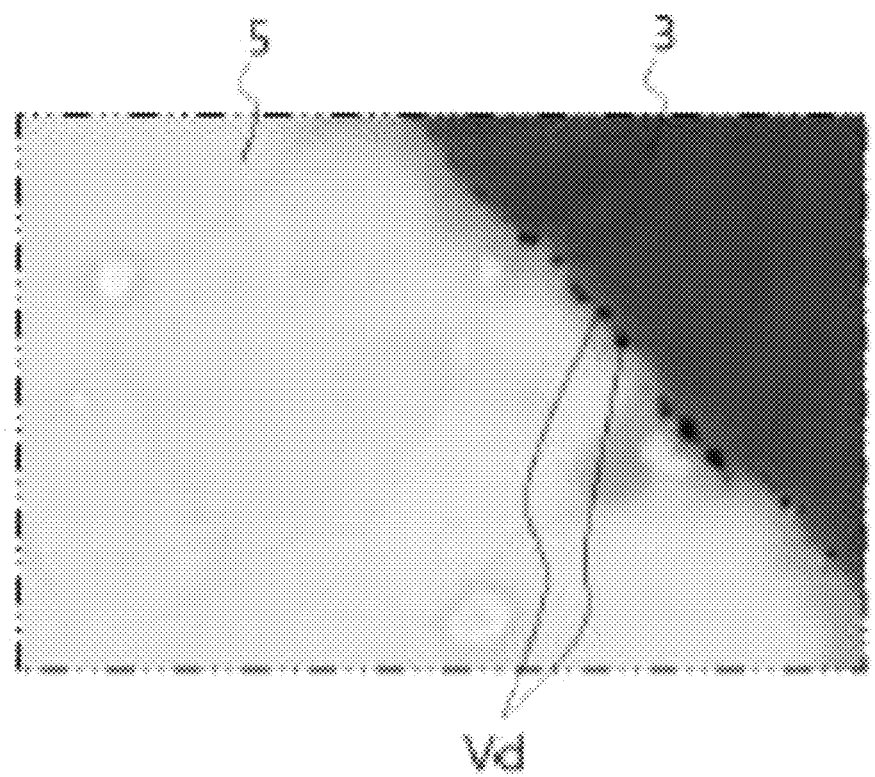
FIG. 6 is a cross-sectional image taken from a part VI of FIG. 4.

By the reflow process or the like, an intermetallic compound ($Cu_6Sn_5$) is produce in between the copper layer 3 and the solder layer 5 of the solder particle S, thereby causing a kirkendall void Vd on an interface of the solder particle S, i.e. between the copper layer 3 and the solder layer 5 as shown in FIG. 6.

However, according to the foregoing embodiment of the present invention, the copper-free metal layer 13 is formed in between the plastic core 11 and the solder layer 15, and therefore the intermetallic compound ($Cu_6Sn_5$) of copper and tin is not formed, thereby causing no void in the packaging process. Besides, the copper-free metal layer 13 includes the foregoing material to improve the adhesion between the plastic core 11 and the solder layer 15 as described above.

Referring back to FIG. 1 to FIG. 3, the solder layer 15 is a tin (Sn)-based lead-free soldering material, which contains not less than about 85 wt % tin (Sn). According to some optional embodiments, the solder layer 15 may contains not less than about 90 wt %, for example, about 95 wt % tin (Sn).

The solder layer 15 may contain at least one of silver (Ag), copper (Cu), bismuth (Bi), zinc (Zn) and indium (In) in addition to tin (Sn). If the solder layer 15 includes silver (Ag) and copper (Cu), it may contain silver (Ag) more than copper (Cu) in order to lower a melting point. For example, the solder layer 15 may contain about 3.5 wt % silver (Ag) and about 0.5 wt % copper (Cu) in addition to tin (Sn), but this is not construed as limiting the present invention.

The solder layer 15 is formed by the sputtering process. Specifically, the copper-free metal layer 13 and the solder layer 15 according to the present invention are successively formed by the sputtering process in one chamber. This will be described later.

Since the solder layer 15 is formed on the surface of the copper-free metal layer 13 by the sputtering process, the solder layer 15 can have a substantially smooth external surface and uniform thickness so as to not only be in close contact with the surface of the copper-free metal layer 13 but also substantially exclude impurities (e.g. organic materials) from materials (e.g. the soldering material) emitted from a target. For instance, the solder layer 15 according to this embodiment of the present invention is clearly different from i) a "solder layer" that has high surface roughness (i.e. an uneven external surface) due to a plurality of conductive particles (or protrusions) on its external surface, and ii) a "solder layer" formed by a plating process that necessarily involves the organic materials derived from a dispersing agent, an acidity controlling agent, etc. inevitably contained in a plating composition.

The solder particle 10 with the plastic core 11 according to the embodiments of the present invention is distinct from a solder particle made of the soldering material without the plastic core. In a particular case of a solder particle that has no particle core and contains not less than about 85 wt % tin (Sn), the solder particle is easily deformed due to tin (Sn) having high ductility. If the solder particles interposed in between the wiring substrate and the element (e.g. the semiconductor chip package for the BGA) are deformed (e.g. deformed into an oval shape), neighboring solder particles may come into contact with each other and be thus electrically connected to thereby cause defective contact.

However, in the solder particle 10 with the plastic core 11 according to an embodiment of the present invention, the plastic core 11 prevents or decreases deformation, and distributes and/or absorbs stress due to the weight of the element (e.g. a semiconductor chip package for a BGA).

A ratio of a diameter R of the plastic core 11 and a thickness d3 of the solder layer 15 may be selected within a range of 0.5:1 to 5.2:1. The diameter R of the plastic core 11 may be selected within a range of 20 μm to 180 μm. The thickness d3 of the solder layer 15 may be selected within a range of 30 μm to 60 μm. If the diameter R of the plastic core 11 and the thickness d3 of the solder layer 15 are within the foregoing ranges, it is possible to not only perform a basic function of the solder particle 10 for electric connection, but also prevents unnecessary electric contact between the neighboring solder particles 10 due to the deformation of the solder particle 10 in a package having electrodes of a fine pitch (e.g. 400 μm).

A thickness d1 of the copper-free metal layer 13 may be equal to or smaller than a hundredth of the thickness d3 of the solder layer 15. For example, the thickness d1 of the copper-free metal layer 13 may be selected within a range of 0.1 μm to 0.5 μm. According to some optional embodiments, the thickness d1 of the copper-free metal layer 13 may be selected within a range of 0.2 μm to 0.4 μm. If the thickness d1 of the copper-free metal layer 13 is selected out of the foregoing ranges, the adhesion between the plastic core 11 and the solder layer 15 may deteriorate and there is a limit to reducing the size of the solder particle 10.

As shown in FIG. 2 and FIG. 3, the solder particle 10 includes the copper-free metal layer 13 directly contacting and covering the external surface of the plastic core 11, and the solder layer 15 directly contacting and covering the entire external surface of the copper-free metal layer 13. In addition, the solder particle 10 may further include a protection layer 17 on the external surface of the solder layer 15 as shown in FIG. 3.

The protection layer 17 may include a metallic material. For example, the protection layer 17 is made of copper-free metal, in which the metallic material may include one of an alloy of nickel (Ni) and chrome (Cr), titanium (Ti), molybdenum (Mo), stainless steel (SUS), and an alloy of them. According to some optional embodiments, the protection layer 17 may include the same material as the copper-free metal layer 13.

The protection layer 17 prevents the solder layer 15 from being contaminated during manufacturing and distributing processes. During the packaging process, the protection layer 17 is broken by predetermined pressure as it is interposed in between the wiring substrate and the element (e.g. the semiconductor chip package for the BGA) during the packaging process. Therefore, the solder layer 15 can take part in the packaging process. To this end, the protection layer 17 may have a thickness of 0.3 µm or less.

Figure 7:
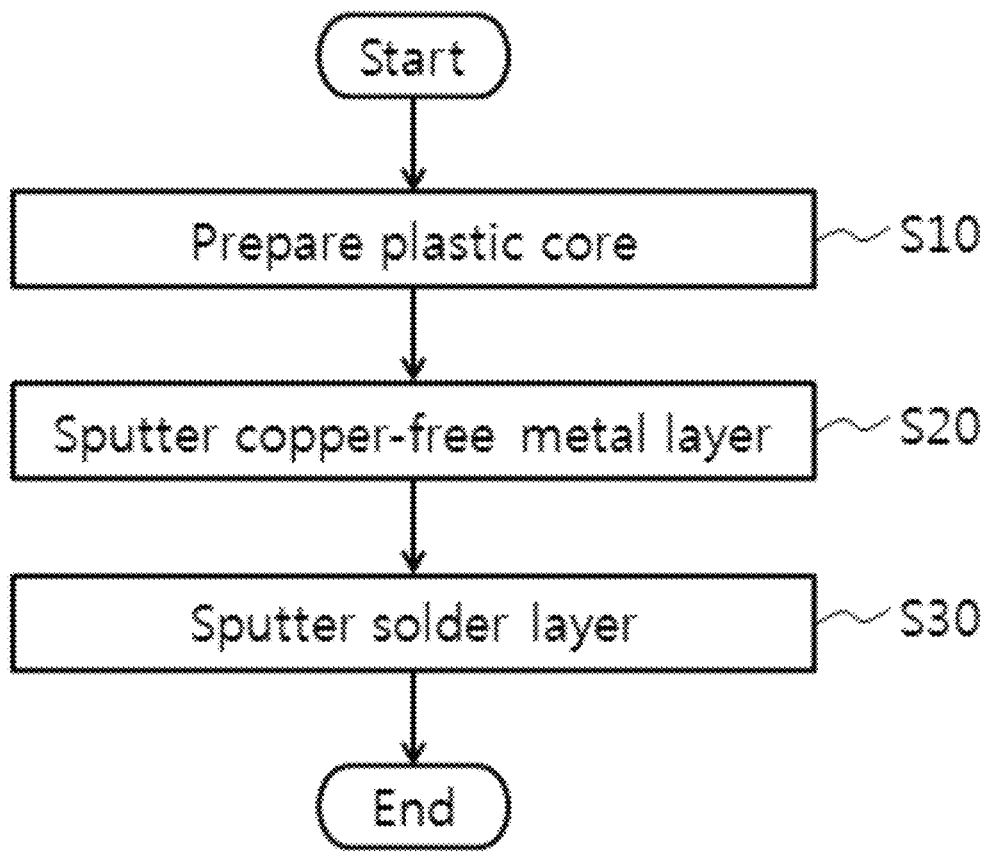
FIG. 7 is a flowchart of schematically showing a method of manufacturing a solder particle according to an embodiment of the present invention.
Figure 8:
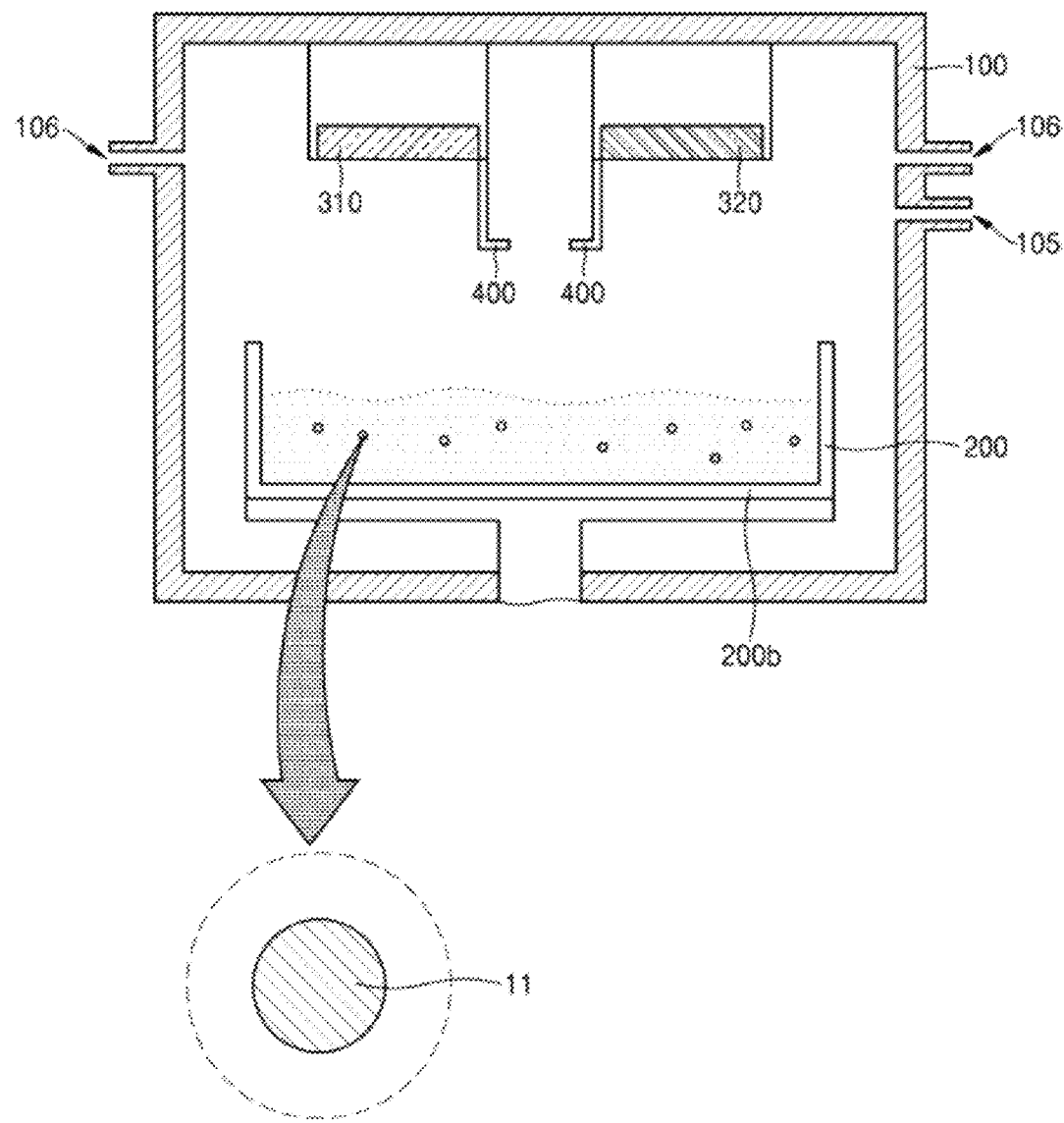
FIG. 8 is a schematic view of a sputtering apparatus used in the manufacturing method.

FIG. 7 is a flowchart of schematically showing a method of manufacturing a solder particle according to an embodiment of the present invention, and FIG. 8 is a schematic view of a sputtering apparatus used in the manufacturing method.

Referring to FIG. 1 to FIG. 3 and FIG. 7 and FIG. 8, the plastic core 11 is prepared (S10). The plastic core 11 refers to a solid spherical particle, a diameter of which is selected within a range of about 20 µm to 180 µm. The plastic core 11 is accommodated in a container 200 of the sputtering apparatus. Since a plurality of plastic cores 11 is given in powder form, it can be mixed in the container 200 by a separator (not shown) during the sputtering process.

The plastic core 11 may be preprocessed in order to improve adhesion with the copper-free metal layer 13 in the following process and/or in order to remove various contaminants, water, static electricity, etc. from the surface of the plastic core 11. Such a preprocessing process may for example include at least one of a plasma process and an ultrasonic process with regard to the surface of the plastic core 11.

In the plasma process, the surface of the plastic core 11 is subject to the plasma process under an atmosphere including at least one of argon, oxygen and nitrogen. In the ultrasonic process, ultrasonic vibrations cause friction between the plastic cores 11, thereby removing various contaminants or the like from the surface of the plastic core 11.

Then, the copper-free metal layer 13 and the solder layer 15 are successively formed by the sputtering process in one chamber 100. Furthermore, the protection layer 17 is also successively formed by the sputtering process in the same chamber 100.

Specifically, the chamber 100 is made vacuum through an exhaust port 105, i.e. has an internal vacuum state. For example, the interior of the chamber 100 has a vacuum level of about 0.1 mTorr to 10 mTorr, but this is not construed as limiting the present invention. Then, the copper-free metal layer 13 is formed on the external surface of the plastic core 11 by the sputtering process (S20).

The chamber 100 is filled with argon or the like inert gas through an introduction port 106, and electric power is applied to a cathode electrode of a first target 310, thereby generating plasma. According to an embodiment, the inert gas may be supplied at a flow speed of 10 sccm to 500 sccm, but this is not construed as limiting the present invention. The electric power supplied to the cathode electrode may include a radio frequency (RF) power or a direct current (DC) power. Plasma ions or neutral particles hit the surface of the first target 310, and thus atoms separated from the first target 310 are formed as a layer, i.e. the copper-free metal layer 13 on the external surface of the plastic core 11. The copper-free metal layer 13 is formed to entirely cover the external surface of the plastic core 11. Further, a blocking screen 400 is interposed in between the first target 310 and a second target 320 so that the second target 320 can be prevented from being contaminated while the copper-free metal layer 13 is formed by the first target 310.

The first target 310 placed within the chamber 100 includes a copper-free metallic material. The copper-free metallic material may for example include at least one of an alloy of nickel and chrome, titanium and stainless steel (SUS).

According to some optional embodiments, the first target 310 may contain the alloy of nickel and chrome, and thus the copper-free metal layer 13 formed using the first target 310 may also contain the alloy of nickel and chrome, in which nickel content may be higher than chrome content. For example, the copper-free metal layer 13 including the alloy of nickel and chrome, a weight ratio of nickel and chrome may be selected within a range of 8:2 to 9.5:0.5.

If the sputtering process is performed with only magnetic nickel, the efficiency of the sputtering process is lowered and thus the thin film of the copper-free metal layer 13 deteriorates in quality such as uniformity of thickness, etc. On the other hand, according to an embodiment of the present invention, if the first target 310 contains chrome, i.e. is made of the alloy of nickel and chrome, it is possible to improve the quality of the thin film formed by the sputtering process, i.e. the copper-free metal layer 13. Besides, it is also possible to improve the adhesion between the plastic core 11 and the solder layer 15 as described above.

Next, the cathode electrode connected to the first target 310 is turned off, and then the electric power is supplied to the cathode electrode of the second target 320, thereby sputtering the solder layer 15 on the external surface of the copper-free metal layer 13 (S30). The chamber 100 for forming the solder layer 15 may have the same vacuum level as the chamber 100 for forming the copper-free metal layer 13. Like the foregoing process, the inert gas may be supplied at a flow speed of 10 sccm to 500 sccm, but this is not construed as limiting the present invention. Since the blocking screen 400 is interposed in between the second target 320 and the first target 310, the first target 310 can be prevented from being contaminated while the solder layer 15 is formed by the second target 320.

As the cathode electrode of the second target 320 is turned on, plasma ions or neutral particles hit the surface of the first target 310, and atoms separated from the second target 320 are formed as a layer, i.e. the solder layer 15 on the external surface of the copper-free metal layer 13. The sputtering process for the copper-free metal layer 13 using the first target 310 and the sputtering process for the solder layer 15 using the second target 320 are successively performed in the same chamber 100. Therefore, another layer (e.g. an oxide layer) except the layers of materials for the copper-free metal layer 13 and the solder layer 15 is prevented from being formed in between the copper-free metal layer 13 and the solder layer 15.

The second target 320 includes a tin (Sn)-based lead-free soldering material. For example, the second target 320 contains not less than about 85 wt % tin (Sn). According to some optional embodiments, the second target 320 may contains not less than about 90 wt %, for example, about 95 wt % tin (Sn).

The second target 320 may contain at least one of silver (Ag), copper (Cu), bismuth (Bi), zinc (Zn) and indium (In) in addition to tin (Sn). If the second target 320 includes silver (Ag) and copper (Cu), it may contain silver (Ag) more than copper (Cu) in order to lower a melting point. For example, the second target 320 may contain about 3.5 wt % silver (Ag) and about 0.5 wt % copper (Cu) in addition to tin (Sn), but this is not construed as limiting the present invention.

The materials of the second target 320 are separated from the second target 320 by the plasma ions or neutral particles, and deposited on the external surface of the copper-free metal layer 13, thereby forming the solder layer 15. The thickness of the solder layer 15 is 100 or more times greater than the thickness of the copper-free metal layer 13 as described with reference to FIG. 1 to FIG. 3.

As mentioned above, the solder layer 15 formed by the sputtering process does not necessarily involve the organic materials derived from various dispersing agents, acidity controlling agents and the like that are inevitably contained in the plating composition for the plating process. The solder layer 15 formed by the sputtering method has a denser film structure than the solder layer formed by the plating process, thereby decreasing or preventing a crack due to the weight or the like of the element during the packaging process.

Figure 9:
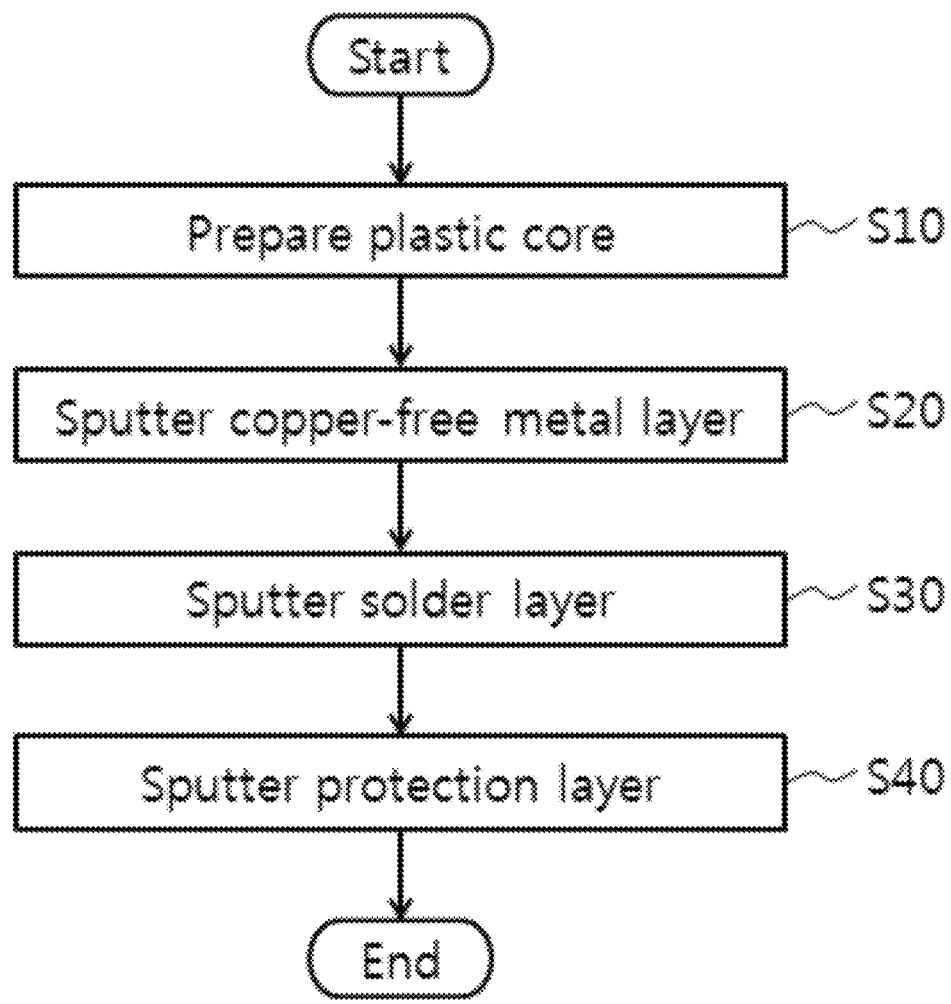
FIG. 9 is a flowchart of schematically showing a method of manufacturing a solder particle according to another embodiment of the present invention.

FIG. 9 is a flowchart of schematically showing a method of manufacturing a solder particle according to another embodiment of the present invention. Referring to FIG. 9, the copper-free metal layer 13 and the solder layer 15 are formed in sequence on the plastic core 11 through the foregoing stages S10 to S30, and then the protection layer 17 may be sputtered on the external surface of the solder layer 15 (S40).

The protection layer 17 may include the same materials as the copper-free metal layer 13. For example, while the cathode electrode connected to the second target 320 is turned off, the cathode electrode connected to the first target 310 is turned on to generate plasma, thereby forming the protection layer 17 on the external surface of the solder layer 15.

The protection layer 17 protects the solder layer 15, and cracks by the weight or the like of the element when the solder particle 10 is arranged in between the wiring substrate and the element (e.g. the semiconductor chip package for the BGA) during the packaging process, so that the solder layer 15 can take part in connecting the wiring substrate and the element during the reflow process. To this end, the thickness of the protection layer 17 may be smaller than a hundredth of the thickness of the solder layer 15. Specifically, the thickness of the protection layer 17 may for example be equal to or smaller than 0.4 µm, or may for example be equal to or smaller than 0.3 µm.

Although it is not shown in FIG. 7 and FIG. 9, a process of drying the solder particle 10 may be performed after forming the solder layer 15 or the protection layer 17. In the drying process, the solder particle 10 may be dried under conditions of a relative humidity of 25% or less (e.g. a relative humidity of 5% to 25%) and a temperature of 50° C. to 80° C. for 1 to 2 hours. Such a drying temperature may be controlled by gradually increasing the temperature from the room temperature up to a specific temperature.

According to the embodiments of the present invention, there is provided a solder particle with a copper-free metal layer, which is excellent in strength and conductivity and prevents or minimizes generation of a void during a reflow process or the like. Of course, the scope of the present invention is not limited to these effects.

Although a few exemplary embodiments of the present invention have been shown and described, these are for illustrative purpose only and it will be appreciated by those skilled in the art that changes may be made in these embodiments without departing from the principles and spirit of the invention, the scope of which is defined in the appended claims and their equivalents.

What is claimed is:

1. A solder particle consisting of:
   a plastic core;
   a copper-free metal layer which is formed on an external surface of the plastic core and made of a nickel-chromium alloy, wherein a weight ratio of nickel to chromium ranges 8:2 to 9.5:0.5,
   wherein a thickness of the copper free metal ranges 0.2 µm to 0.4 µm;
   a solder layer which is formed on the copper-free metal layer and contains not less than 85 wt % tin; and
   a protection layer which is formed on an entire external surface of the solder layer and made of the nickel-chromium alloy,
   wherein a thickness of the protection layer is 0.2 µm or less.

2. The solder particle according to claim 1, wherein the copper-free metal layer, the solder layer, and the protection layer are successively formed in one chamber by a sputtering process.

3. The solder particle according to claim 1, wherein a thickness of the copper-free metal layer is equal to or smaller than a hundredth of a thickness of the solder layer.

4. The solder particle according to claim 1, wherein the plastic core is made of silicon.

* * * * *